US011984168B2

(12) United States Patent
Gupta et al.

(10) Patent No.: US 11,984,168 B2
(45) Date of Patent: May 14, 2024

(54) HIGH SPEED TOGGLE MODE TRANSMITTER WITH CAPACITIVE BOOSTING

(71) Applicant: SanDisk Technologies LLC, Addison, TX (US)

(72) Inventors: Nitin Gupta, Bangalore (IN); Shiv Harit Mathur, Bangalore (IN); Ramakrishnan Subramanian, Bangalore (IN); Dmitry Vaysman, San Jose, CA (US)

(73) Assignee: SanDisk Technologies LLC, Austin, TX (US)

( * ) Notice: Subject to any disclaimer, the term of this patent is extended or adjusted under 35 U.S.C. 154(b) by 44 days.

(21) Appl. No.: 17/835,324

(22) Filed: Jun. 8, 2022

(65) Prior Publication Data
US 2023/0402107 A1 Dec. 14, 2023

(51) Int. Cl.
*G11C 7/10* (2006.01)
*G11C 11/16* (2006.01)
*G11C 16/30* (2006.01)

(52) U.S. Cl.
CPC ............ *G11C 16/30* (2013.01); *G11C 7/1096* (2013.01); *G11C 11/1697* (2013.01)

(58) Field of Classification Search
CPC .... G11C 16/30; G11C 7/1096; G11C 11/1697
See application file for complete search history.

(56) References Cited

U.S. PATENT DOCUMENTS

| | | | |
|---|---|---|---|
| 4,972,101 A | 11/1990 | Partovi et al. | |
| 6,459,331 B1 * | 10/2002 | Takeuchi | H03K 17/162 |
| | | | 327/554 |
| 9,130,794 B2 | 9/2015 | Agrawal et al. | |
| 9,306,563 B2 | 4/2016 | Gondi et al. | |
| 10,163,480 B1 | 12/2018 | Kawamura et al. | |
| 10,818,685 B2 | 10/2020 | Dunga et al. | |

OTHER PUBLICATIONS

Constantin, Valentin, et al., "Reduction of the High-Frequency Switching Noise in the MCP16301 High-Voltage Buck Converter," AN1466, Microchip Technology Inc., Feb. 2013, 10 pages.

* cited by examiner

*Primary Examiner* — Jay W. Radke
(74) *Attorney, Agent, or Firm* — Vierra Magen Marcus LLP

(57) ABSTRACT

An interface circuit that can operate in toggle mode at data high transfer rates while reducing the self-induced noise is presented. The high speed toggle mode interface supplies a data signal to a data line or other transfer line by a driver circuit. The driver circuit includes a pair of series connected transistors connected between a high supply level and a low supply level, where the data line is supplied from a node between the two transistors. A resistor is connected between one or both of the transistors and one of the supply levels, with a capacitor connected between the low supply level and a node between the resistor and the transistor. The resistor helps to isolate the transistor from the supply level while the capacitor can act as current reservoir to boost the current to the transistor during data transition, reducing the noise seen by the voltage supply.

20 Claims, 12 Drawing Sheets

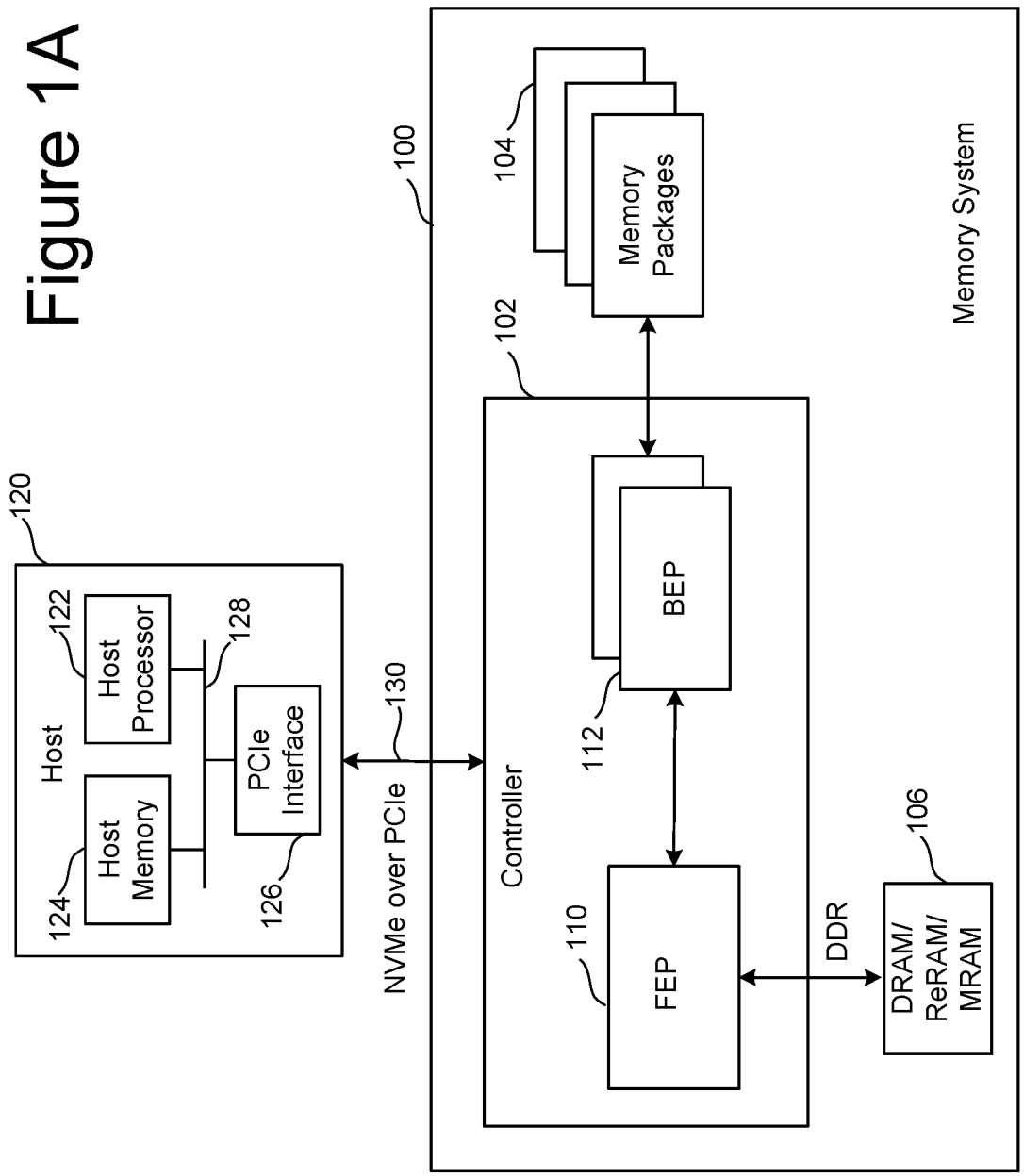

HIGH SPEED TOGGLE MODE TRANSMITTER WITH CAPACITIVE BOOSTING

BACKGROUND

The present technology relates to the operation of memory devices.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Important properties of non-volatile memory devices include storage capacity, power consumption, and read and write performance. One component of read and write performance is the speed with which data can be transferred between a memory controller and the memory die. As transfer speeds increase, it can become difficult accurately transmit data, particularly when combined with the often competing aims of lowering power consumption and increasing memory capacity.

BRIEF DESCRIPTION OF THE DRAWINGS

FIG. 1A is a block diagram of one embodiment of a memory system connected to a host.

DETAILED DESCRIPTION

Figure 1B:
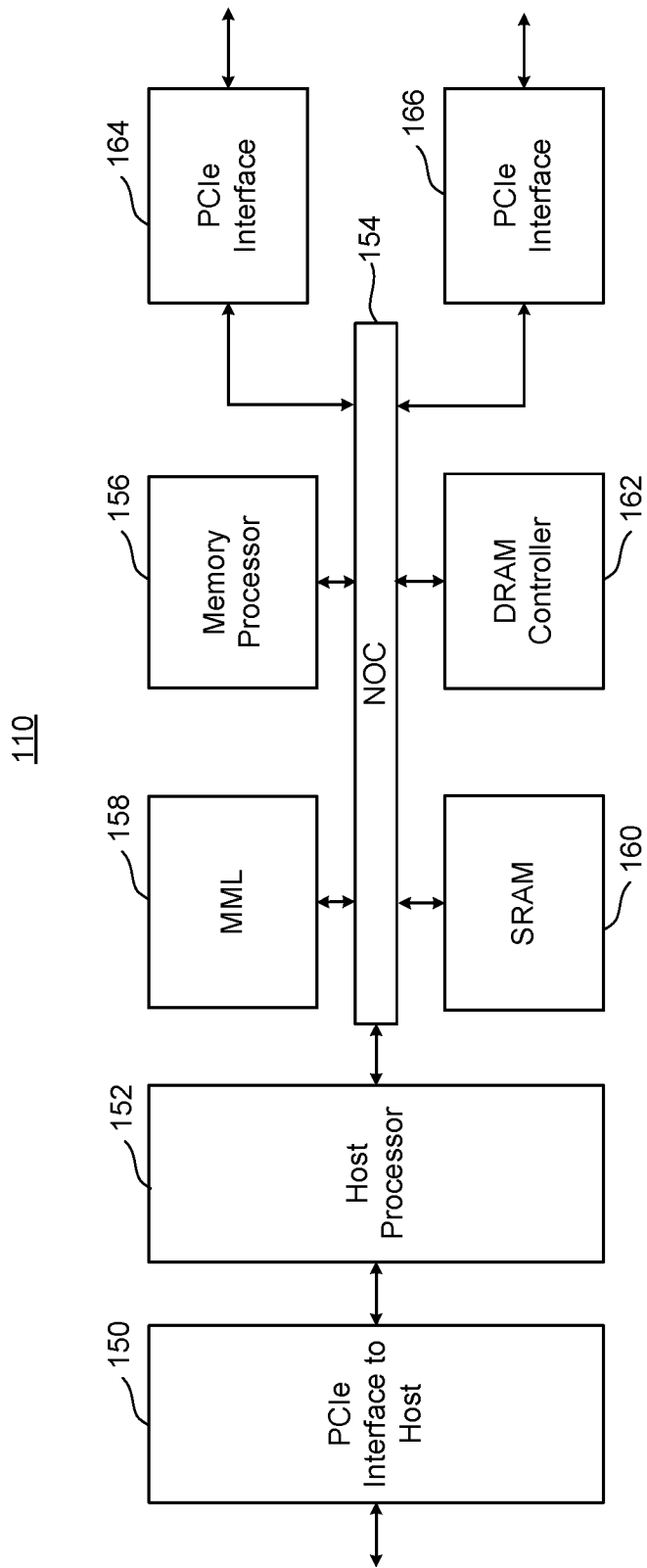
FIG. 1B is a block diagram of one embodiment of a Front End Processor Circuit. In some embodiments, the Front End Processor Circuit is part of a Controller.

Read and write speed is an important figure of merit for non-volatile memory devices, such as NAND memory. A significant contribution to the time it takes to read or write data comes from the time taken to transfer data between the memory controller and the memory die storing the data, so that controller-memory interface speed is critical to read/write performance. As host speeds and memory densities both increase, challenges arise with meeting the wanted transfer speeds as the controller-memory interface is limited by signal degradation due to high memory die load and self-induces supply noise. The following presents embodiments for an interface that reduces noise by reducing amount the fluctuations in the current supplied to the drivers of the interface, SI, as the switching time, St, is decreased.

More specifically, the following presents an interface circuit that can operate in toggle mode at high data transfer rates while reducing the self-induced noise of the interface. A high speed toggle mode interface supplies a data signal to a data line or other transfer line by a driver circuit. The driver circuit includes a pair of transistors connected in series between a high supply level and a low supply level, wherein the data line is supplied driven) from a node between the two transistors. Each of at least one resistor is connected between a respective one of the transistors and a respective one of the supply levels, and each of at least one capacitor is connected between the low supply level (e.g., ground) and a respective node between a respective one of the at least one resistor and a respective one of the pair of transistors. The resistor helps to isolate the transistor from the supply level variations while the capacitor can act as current reservoir to boost the current to the transistor during data transition, reducing the noise ($\delta I/\delta t$) induced on the voltage supply.

FIG. 1A is a block diagram of one embodiment of a memory system 100 connected to a host 120. Memory system 100 can implement the technology presented herein for programming of multi-level memories. Many different types of memory systems can be used with the technology proposed herein. Example memory systems include solid state drives ("SSDs"), memory cards including dual in-line memory modules (DIMMs) for DRAM replacement, and embedded memory devices; however, other types of memory systems can also be used.

Memory system 100 of FIG. 1A comprises a controller 102, non-volatile memory 104 for storing data, and local memory (e.g., DRAM/ReRAM/MRAM) 106. Controller 102 comprises a Front End Processor (FEP) circuit 110 and one or more Back End Processor (BEP) circuits 112. In one embodiment FEP circuit 110 is implemented on an Application Specific Integrated Circuit (ASIC). In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase, and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory, such as storage class memory (SCM) based on resistive random access memory (such as ReRAM, MRAM, FeRAM or RRAM) or a phase change memory (PCM). In other embodiments, the BEP or FEP can be included on the memory die.

Controller 102 communicates with host 120 via an interface 130 that implements a protocol such as, for example, NVM Express (NVMe) or Compute Express Link (CXL) over PCI Express (PCIe) or using JEDEC standard Double Data Rate or Low-Power Double Data Rate (DDR or LPDDR) interface such as DDR5 or LPDDR5. For working with memory system 100, host 120 includes a host processor 122, host memory 124, and a PCIe interface 126 connected along bus 128. Host memory 124 is the host's physical memory, and can be DRAM, SRAM, MRAM, non-volatile memory, or another type of storage. Host 120 is external to and separate from memory system 100. In one embodiment, memory system 100 is embedded in host 120.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 1B, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 326 of FIGS. 1E and 2A below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

Figure 1C:
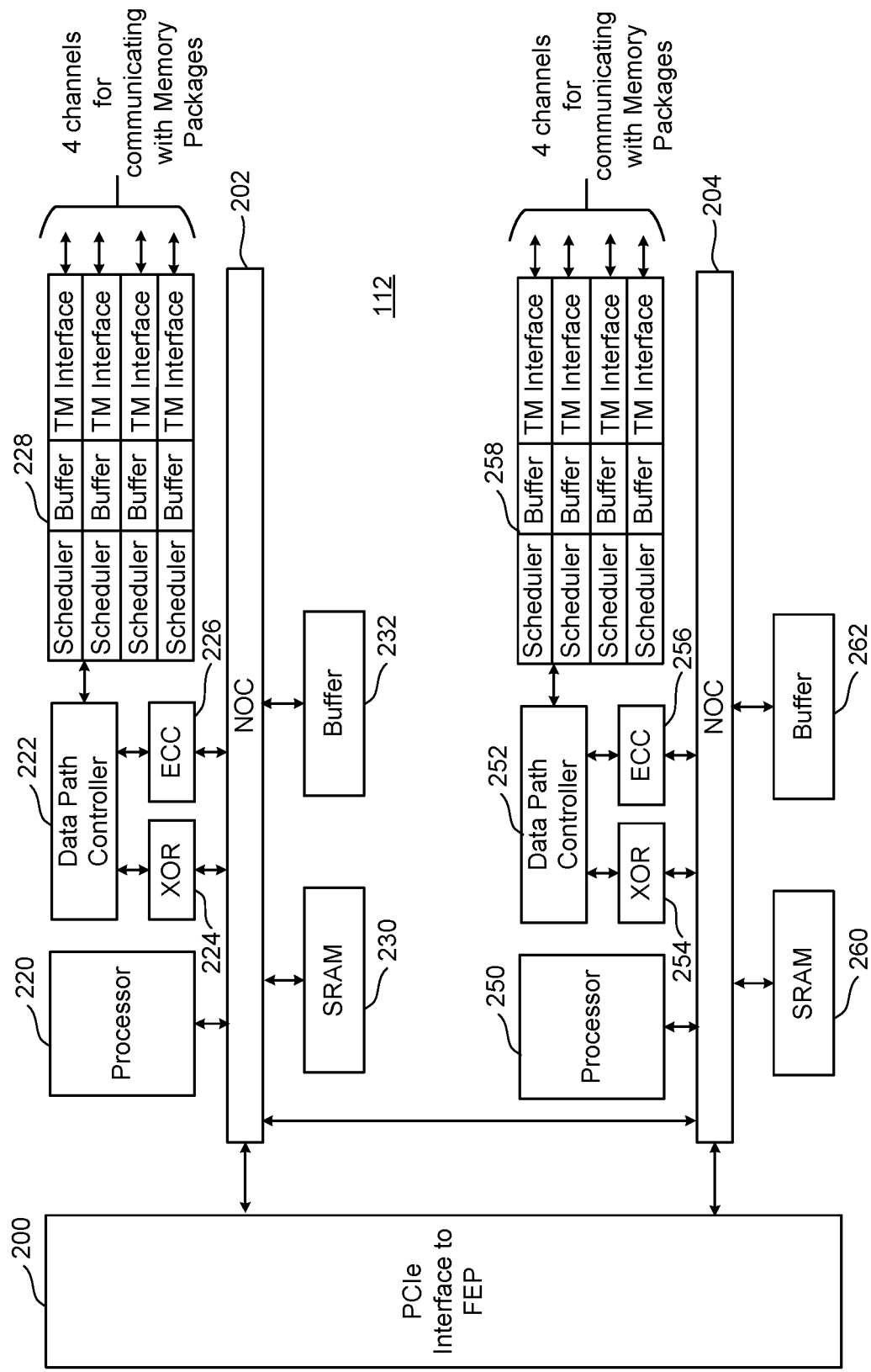
FIG. 1C is a block diagram of one embodiment of a Back End Processor Circuit. In some embodiments, the Back End Processor Circuit is part of a Controller.

FIG. 1C is a block diagram of one embodiment of the BEP circuit 112. FIG. 1C shows a PCIe Interface 200 for communicating with the FEP circuit 110 (e.g., communicating with one of PCIe Interfaces 164 and 166 of FIG. 1). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer, and TM Interface for each of the channels. The processor can be any standard processor known in the art. The data path controllers 222/252 can be a processor, FPGA, microprocessor, or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 1D:
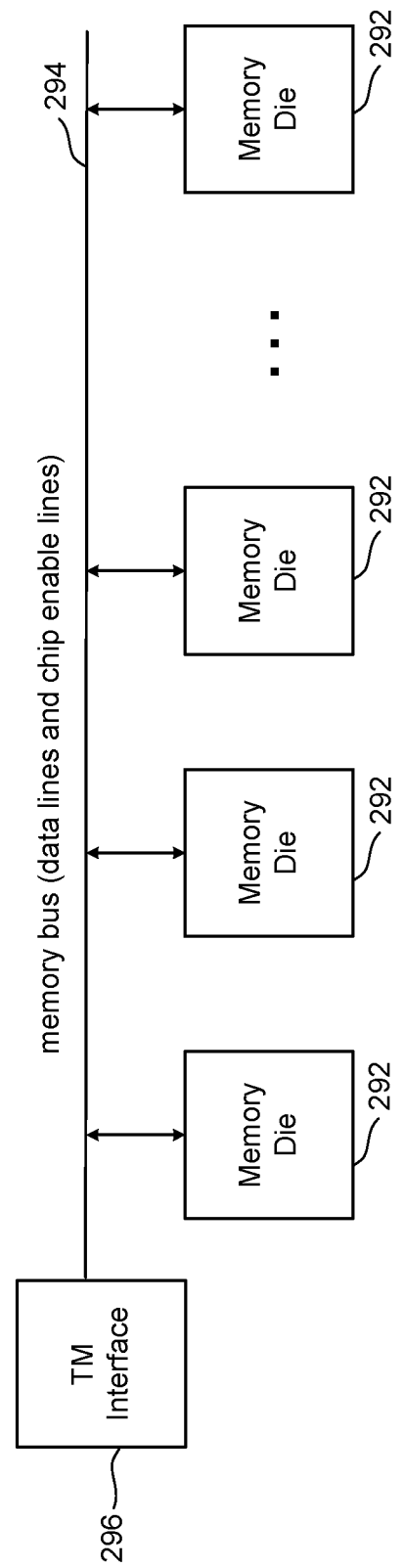
FIG. 1D is a block diagram of one embodiment of a toggle mode interface connected to multiple memory die.

FIG. 1D is a block diagram of one embodiment of a toggle mode interface 296 connected to multiple memory die 292 connected to a memory bus (data lines and chip enable lines) 294. Depending on the embodiment, the toggle mode interface 294 can, along with the memory die 292, be part of a memory package 104 or one of the TM interfaces of interfaces 228/258 of a BEP circuit 112 (see e.g., FIG. 1C). (Each of the memory die can also include an interface for receiving toggle mode transmissions and transmitting toggle mode signals in the other direction as part of interface 368 of FIGS. 2A and 2B discussed below). A memory bus 294 connects the toggle mode interface 296 to the one or more memory die 292. In some embodiments, a memory package can include a small controller connected to the memory bus 294 and the TM Interface 296. The memory package can have one or more memory die. In one embodiment, each memory package includes eight or 16 memory die; however, other numbers of memory die can also be implemented. In another embodiment, the toggle mode interface is instead JEDEC standard DDR or LPDDR with or without variations such as relaxed time-sets or smaller page size. The technology described herein is not limited to any particular number of memory die.

Figure 1E:
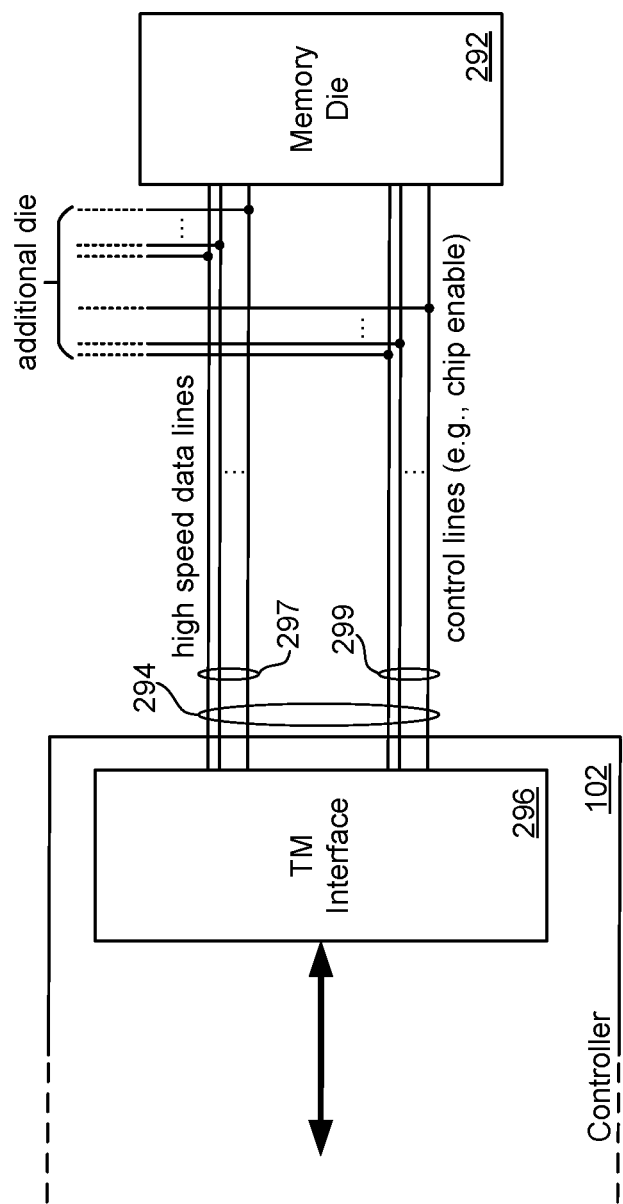
FIG. 1E is a block diagram illustrating an embodiment of the bus structure between a toggle mode interface and a memory die in more detail.

FIG. 1E is a block diagram illustrating an embodiment of the bus structure 294 between a toggle mode interface 296 and a memory die 292 in more detail. In the example of FIG. 1E, the toggle mode interface 296 is shown as part of the memory controller 102 and only a single memory die 292 is shown, although one or more additional memory die or other circuits may also be connected. One part of the memory bus 294 as a set of one or more high speed data lines 297 that can exchange data, addresses, and commands using toggle mode. The number of such lines can vary depending on the embodiment, where the use of 8 lines operating in parallel will be used in the following when referring to a specific example for transmitting data between a memory die 292 and the toggle mode interface 296. Also connected between the toggle mode interface 296 and the one or more memory die 292 as part of the memory bus 294 are one or more memory the control lines 299, such as chip enable or other enable signals, ready/busy signals, and data inversion, which can enable the inversion of the signals on the high speed data lines 297 operating in toggle mode. The number and type of such control lines 299 and the specific signals can vary with the embodiment. The various control signals asserted/de-asserted on the control lines 299 often do not change states at the high rates used on the high speed data lines 297.

Figure 2A:
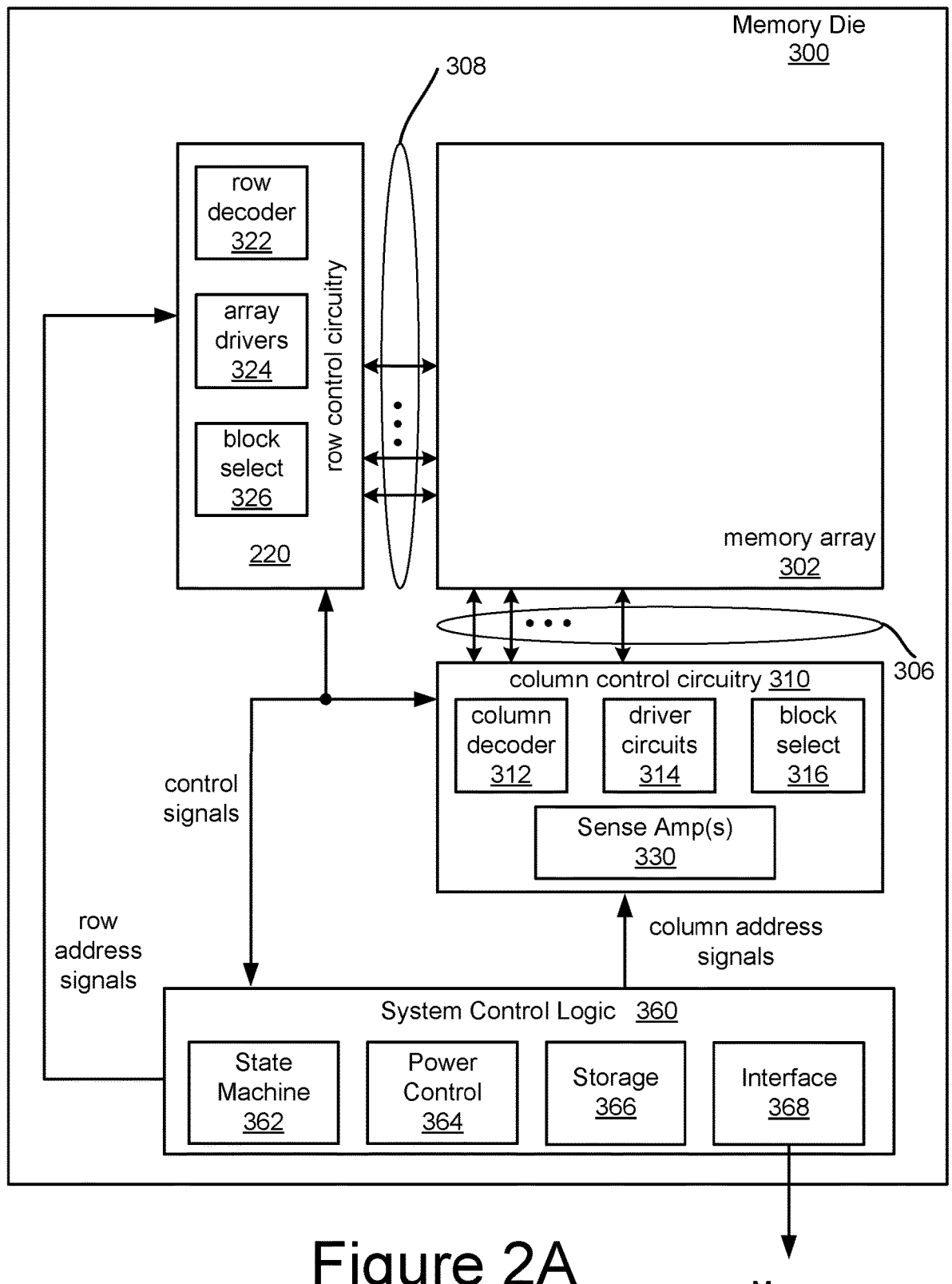
FIG. 2A is a block diagram of one embodiment of a memory die.

In one embodiment, non-volatile memory 130 comprises one or more memory die. FIG. 2A is a functional block diagram of one embodiment of a memory die 300 that comprises non-volatile memory 130. Each of the one or more memory die of non-volatile memory 130 can be implemented as memory die 300 of FIG. 2A. The components depicted in FIG. 2A are electrical circuits. Memory die 300 includes a memory array 302 that can comprise non-volatile memory cells, as described in more detail below. The array terminal lines of memory array 302 include the various layer(s) of word lines organized as rows, and the various layer(s) of bit lines organized as columns. However, other orientations can also be implemented. Memory die 300 includes row control circuitry 320, whose outputs 308 are connected to respective word lines of the memory array 302. Row control circuitry 320 receives a group of M row address signals and one or more various control signals from System Control Logic circuit 360, and typically may include such circuits as row decoders 322, array terminal drivers 324, and block select circuitry 326 for both reading and writing (programming) operations. Row control circuitry 320 may also include read/write circuitry. Memory die 300 also includes column control circuitry 310 including sense amplifier(s) 330 whose input/outputs 306 are connected to respective bit lines of the memory array 302. Although only single block is shown for array 302, a memory die can include multiple arrays that can be individually accessed. Column control circuitry 310 receives a group of N column address signals and one or more various control signals from System Control Logic 360, and typically may include such circuits as column decoders 312, array terminal receivers or driver circuits 314, block select circuitry 316, as well as read/write circuitry, and I/O multiplexers.

System control logic 360 receives data and commands from memory controller 120 and provides output data and status to the host. In some embodiments, the system control logic 360 (which comprises one or more electrical circuits) include state machine 362 that provides die-level control of memory operations. In one embodiment, the state machine 362 is programmable by software. In other embodiments, the state machine 362 does not use software and is completely implemented in hardware (e.g., electrical circuits). In another embodiment, the state machine 362 is replaced by a micro-controller or microprocessor, either on or off the memory chip. System control logic 360 can also include a power control module 364 that controls the power and voltages supplied to the rows and columns of the memory structure 302 during memory operations and may include charge pumps and regulator circuit for creating regulating voltages. System control logic 360 includes storage 366 (e.g., RAM, registers, latches, etc.), which may be used to store parameters for operating the memory array 302.

Commands and data are transferred between memory controller 120 and memory die 300 via memory controller interface 368 (also referred to as a "communication interface"). Memory controller interface 368 is an electrical interface for communicating with memory controller 120. Examples of memory controller interface 368 include a Toggle Mode Interface and an Open NAND Flash Interface (ONFI). Other I/O interfaces can also be used.

In some embodiments, all the elements of memory die 300, including the system control logic 360, can be formed as part of a single die. In other embodiments, some or all of the system control logic 360 can be formed on a different die.

In one embodiment, memory structure 302 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 302 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 302 is not limited to the examples above. Many different types of memory array architectures or memory technologies can be used to form memory structure 302. No particular non-volatile memory technology is required for purposes of the new claimed embodiments proposed herein. Other examples of suitable technologies for memory cells of the memory structure 302 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 302 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—$Sb_2Te_3$ super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 302 and (2) peripheral circuitry, which includes all of the components depicted in FIG. 2A other than memory structure 302. An important characteristic of a memory circuit is its capacity, which can be increased by increasing the area of the memory die of storage system 100 that is given over to the memory structure 302; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 360, reduced availability of area can limit the available functionalities that can be implemented on-chip. Consequently, a basic trade-off in the design of a memory die for the storage system 100 is the amount of area to devote to the memory structure 302 and the amount of area to devote to the peripheral circuitry.

Another area in which the memory structure 302 and the peripheral circuitry are often at odds is in the processing involved in forming these regions, since these regions often involve differing processing technologies and the trade-off in having differing technologies on a single die. For example, when the memory structure 302 is NAND flash, this is an NMOS structure, while the peripheral circuitry is often CMOS based. For example, elements such sense amplifier circuits, charge pumps, logic elements in a state machine, and other peripheral circuitry in system control logic 360 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed die that are then bonded together. More specifically, the memory structure 302 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
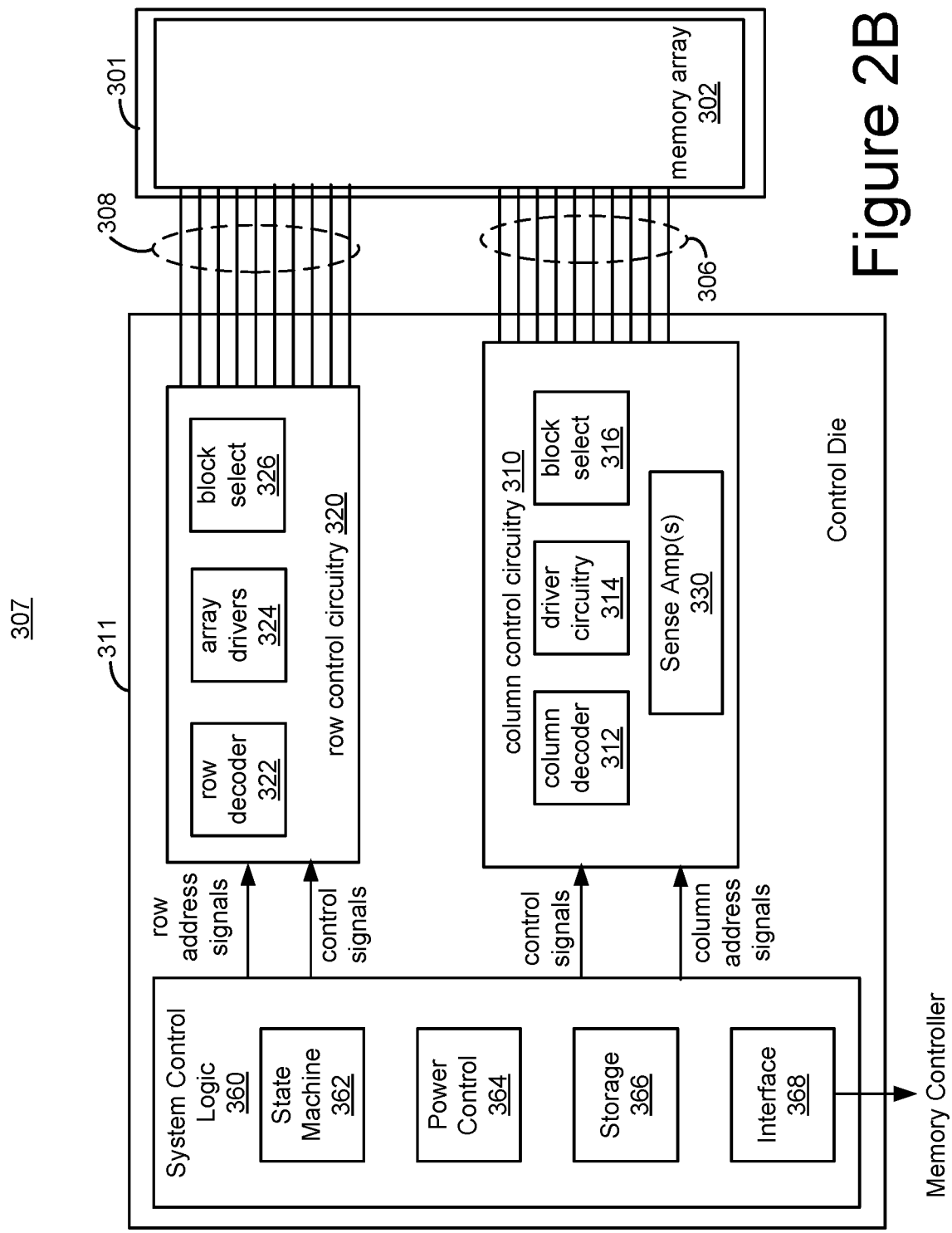
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 307. One or more integrated memory assemblies 307 may be used to implement the non-volatile memory 130 of storage system 100. The integrated memory assembly 307 includes two types of semiconductor die (or more succinctly, "die"). Memory die 301 includes memory structure 302. Memory structure 302 includes non-volatile memory cells. Control die 311 includes control circuitry 360, 310, and 320 (as described above). In some embodiments, control die 311 is configured to connect to the memory structure 302 in the memory die 301. In some embodiments, the memory die 301 and the control die 311 are bonded together.

FIG. 2B shows an example of the peripheral circuitry, including control circuits, formed in a peripheral circuit or control die 311 coupled to memory structure 302 formed in memory die 301. Common components are labelled similarly to FIG. 2A. System control logic 360, row control circuitry 320, and column control circuitry 310 are located in control die 311. In some embodiments, all or a portion of the column control circuitry 310 and all or a portion of the row control circuitry 320 are located on the memory die 301. In some embodiments, some of the circuitry in the system control logic 360 is located on the memory die 301.

System control logic 360, row control circuitry 320, and column control circuitry 310 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 360, row control circuitry 320, and column control circuitry 310). Thus, while moving such circuits from a die such as memory die 301 may reduce the number of steps needed to fabricate such a die, adding such circuits to a die such as control die 311 may not require many additional process steps. The control die 311 could also be referred to as a CMOS die, due to the use of CMOS technology to implement some or all of control circuitry 360, 310, 320.

FIG. 2B shows column control circuitry 310 including sense amplifier(s) 330 on the control die 311 coupled to memory structure 302 on the memory die 301 through electrical paths 306. For example, electrical paths 306 may provide electrical connection between column decoder 312, driver circuitry 314, and block select 316 and bit lines of memory structure 302. Electrical paths may extend from column control circuitry 310 in control die 311 through pads on control die 311 that are bonded to corresponding pads of the memory die 301, which are connected to bit lines of memory structure 302. Each bit line of memory structure 302 may have a corresponding electrical path in electrical paths 306, including a pair of bond pads, which connects to column control circuitry 310. Similarly, row control circuitry 320, including row decoder 322, array drivers 324, and block select 326 are coupled to memory structure 302 through electrical paths 308. Each of electrical path 308 may correspond to a word line, dummy word line, or select gate line. Additional electrical paths may also be provided between control die 311 and memory die 301.

For purposes of this document, the phrases "a control circuit" or "one or more control circuits" can include any one of or any combination of memory controller 120, state machine 362, all or a portion of system control logic 360, all or a portion of row control circuitry 320, all or a portion of column control circuitry 310, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit. In some embodiments, there is more than one control die 311 and more than one memory die 301 in an integrated memory assembly 307. In some embodiments, the integrated memory assembly 307 includes a stack of multiple control die 311 and multiple memory die 301.

Figure 3:
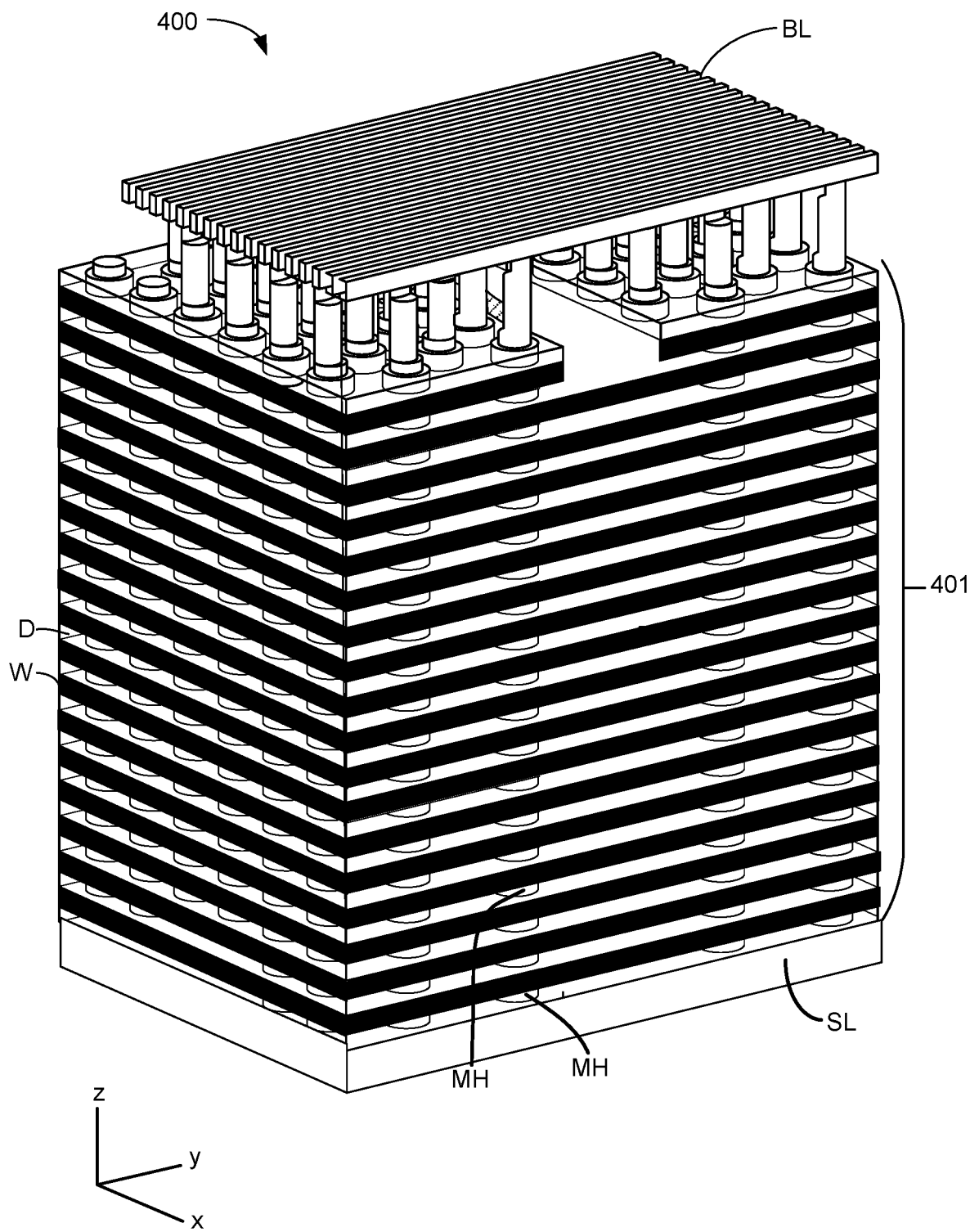
FIG. 3 is a perspective view of a portion of one embodiment of a monolithic three dimensional memory structure.

FIG. 3 is a perspective view of a portion of one example embodiment of a monolithic three dimensional memory array/structure that can comprise memory structure 302, which includes a plurality non-volatile memory cells arranged as vertical NAND strings. For example, FIG. 3 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data.

Figure 4:
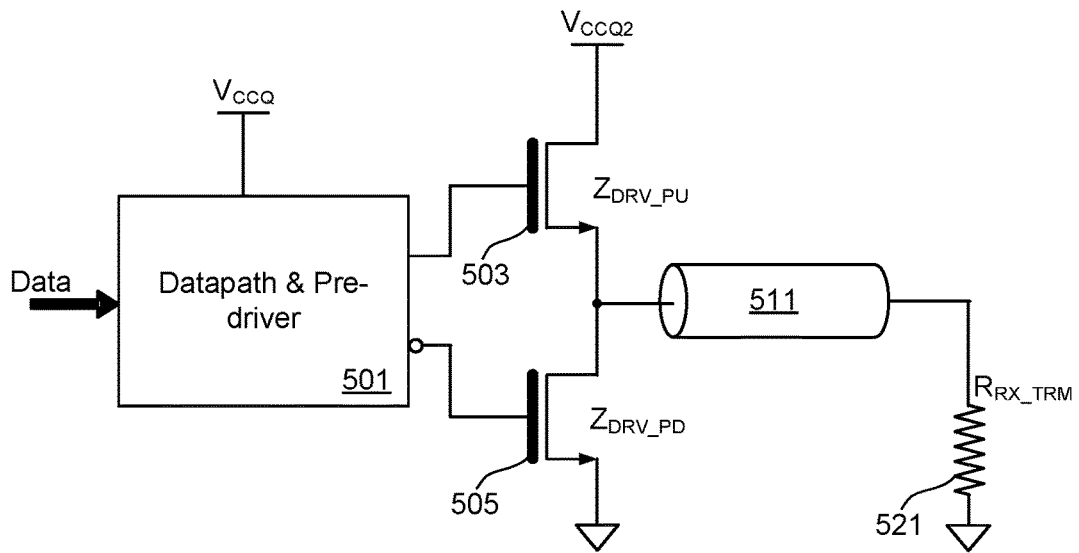
FIG. 4 is a diagram of some of the elements in the path of each of the high speed data lines.

Returning now to FIG. 1E, within the toggle mode interface 296, whether as a toggle mode interface within a controller 102 or a memory package 104, there will be a driver circuit for each of the high speed data lines 297 for transmitting signals to the memory die 292. Similarly, within each memory die 292 will be a driver for each of the high speed data lines 297 for transmitting signals from the memory die 292. FIG. 4 illustrates an example of such a driver circuit.

FIG. 4 is a diagram of some of the elements in the path of each of the high speed data lines. On the transmitter side, the toggle mode interface includes a data-path and pre-driver block 501 and a driver for each of the high speed data lines, where only the driver is explicitly shown and the other element of toggle mode interface are represented by data-path and pre-driver block 501. In this embodiment, the driver circuit includes a pull-up transistor $Z_{DRV\_PU}$ 503 connected in series with a pull-down transistor $Z_{DRV\_PD}$ 505 between a high supply level $V_{CCQ2}$ and ground (or, more generally, a low supply level). In this example, both of $Z_{DRV\_PU}$ 503 and $Z_{DRV\_PD}$ are NMOS devices. The data-path and pre-driver 501 is connected to a high supply level $V_{CCQ}$ that, depending on the embodiment, may be the same as or different than $V_{CCW}$. (A ground connection for data-path and pre-driver 501 is not explicitly shown in FIG. 4 and similar figures discussed below.) The data-path and pre-driver 501 receives an input signal (Data) and applies the corresponding output signal directly to the control gate of pull-up transistor $Z_{DRV\_PU}$ 503 and, in inverted form, to pull-down transistor $Z_{DRV\_PD}$ 505. The output of the driver is then applied to the transmission line 511 to supply (to drive) the load, represented as resistor $R_{RX\_TRM}$ 521.

Relative to FIG. 1E, data-path and pre-driver 501 and the driver ($Z_{DRV\_PU}$ 503 and $Z_{DRV\_PD}$ 505) are part of a TM interface 296 in controller 102, the transmission line 511 corresponds to one of the high speed data lines 297, and the load $R_{RX\_TRM}$ 521 can correspond to one or more of the memory die 292. This correspondence will be used as the example for most of the following discussion, although this presentation can be applied more generally. For example, the data-path and pre-driver 501 and the driver can be part of a memory package 104 along with the one or more memory die 292. When transferring signal from a memory die 292 to the controller (such as during a data read), the transmitter would instead be a memory die 292, the transmission line 511 again one of the high speed data lines 297, and the controller's interface would now be the receiver. More generally, the data-path and pre-driver 501 and the driver can be part of a high speed transmission circuit for any number of applications for driving a load through a transmission line.

Figure 5:
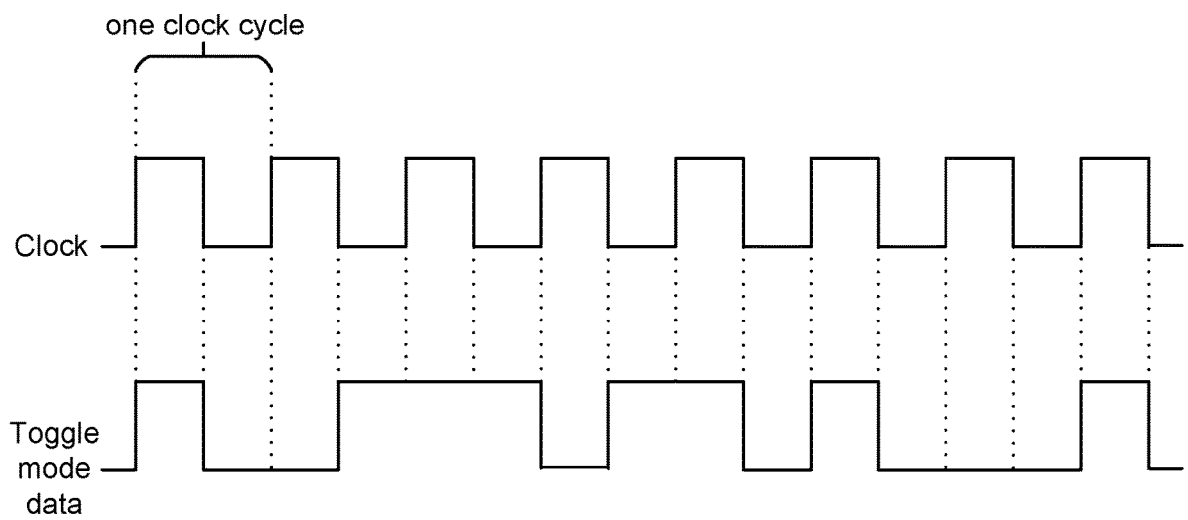
FIG. 5 illustrates the operation of a toggle mode data signal.

In the main embodiments discussed here, the high speed transmission circuit operates in a toggle mode, where FIG. 5 illustrates the operation of a toggle mode data signal. In toggle mode, data values are transmitted for both the leading and trailing edges of an underlying clock signal. At top, FIG. 5 shows a clock signal with the first cycle marked out. Underneath the clock signal is an example of a toggle mode data signal. In this example, the first shown clock cycle carries the data (10), the next clock cycle (01), followed by (11), and so on. Consequently, toggle mode data may switch at twice the clock rate at some cycles or may not change for a number of cycles.

An important consideration in memory devices, such as the NAND or other non-volatile memory, is the speed with which data can be written and read. However, increasing the rate of toggle mode interfaces to very high speeds can present a number of challenges, particularly as loads on such data lines increase due to increased capacities of memory die. In addition to read and write performance and capacity, other important memory considerations are power consumption and reduction in area required for the peripheral circuitry of a memory device, both of which also make difficult to achieve very high toggle mode interface speeds (e.g., multiple gigabits per second).

The driver of FIG. 4 uses supply level $V_{CCQ2}$ that, depending on the embodiment, may the same as or different from $V_{CCQ}$. To reduce power consumption, in some embodiments the level of the voltage supply for $V_{CCQ2}$ uses values of under a volt (e.g., ~0.6V). Such low values make this supply level very sensitive to noise since swing of even ~100-120 mV would be around a change of 20%. As noted with respect to FIG. 1E, there are multiple such high speed data lines 297 and there may be many such channels of the memory controller 102 to the memory packages. As these are commonly fed by the same supply driver, the $V_{CCQ2}$ level is being concurrently used by many drivers switching at high speed, resulting in large fluctuations in the current ($\delta I$) needed to supply the drivers on short times ($\delta t$). Consequently, channel bandwidth and supply noise are a major challenges, but conventional implementations for addressing this are quite costly due to large silicon area requirements, such as for large on-die capacitances or extra logic circuitry on the transmitter.

Considering supply noise ($\delta I/\delta t$), channel equalization, and interdependencies further, the major source of supply noise in the toggle mode interface 296 is self-generated due to the random toggling of data lines 297. One way to reduce address this is by use of an on-die capacitor for the $V_{CCQ2}$ supply line that can serve as charge reservoir for fluctuations in current drawn by the drivers. However, to provide enough capacitance would require a large capacitance with a large area. Another approach is to use encoding schemes for the static or dynamic inversion of the data bits to reduce the amount of toggling, but this would require the introduction of additional control lines, increasing costs and would face form-factor limitations.

Channel bandwidth limits signal quality (signal to noise ration) for the high speed data lines. A conventional channel equalization method for a transmitter is Feed Forward Equalization (FFE), where a current data value is compared to some number of following data values to determine when transitions will occur between data values and then use a dynamic impedance to help during transitions to emphasize anticipated signal loss in the channel. However, the FFE mechanism has a high cost due to larger logic circuitry requirements and a need for several matching paths in the IO layout. FFE can also result in higher supply noise levels, increasing the needed size for the on-die capacitor.

As noted, read/write speed is an important figure of merit for non-volatile memory devices and the toggle mode interface speed is an important factor for the over performance. As host speed and memory density increasing rapidly, the performance of the controller's toggle mode interface is limited by signal degradation due to high die load and self-induced supply noise. To reduce the impact of noise by significantly reducing the supply noise $\delta I/\delta t$, the following presents embodiments for capacitively boosted driver designs.

Figure 6:
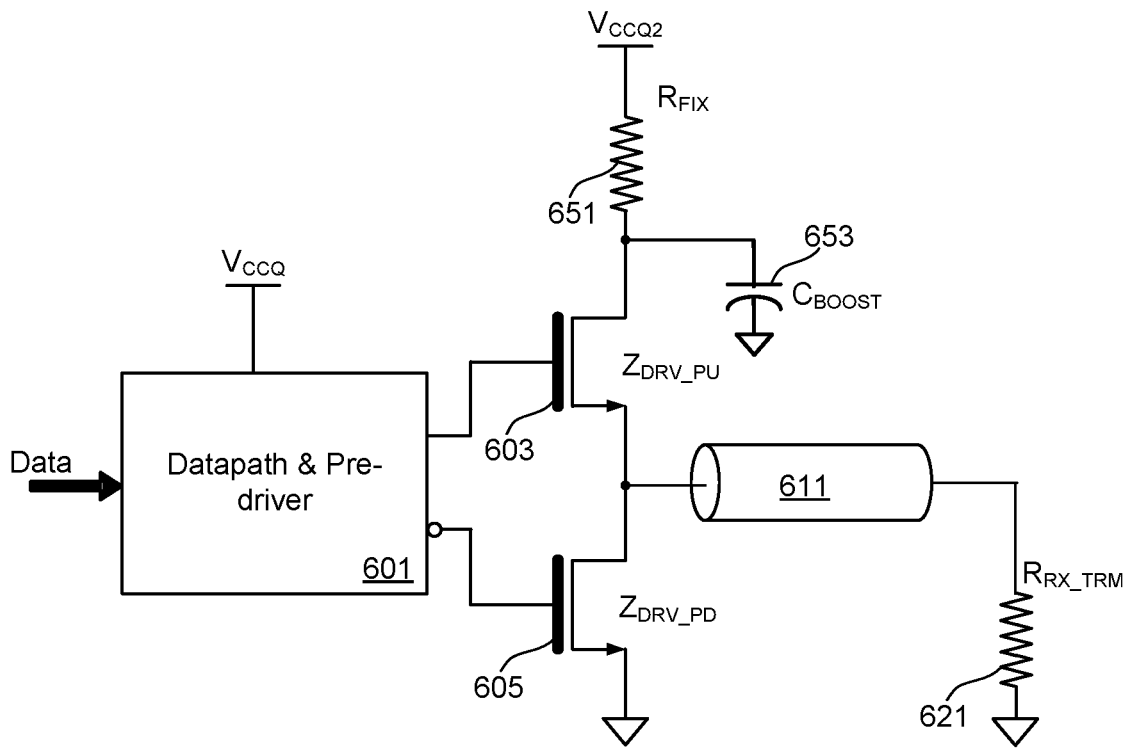
FIG. 6 illustrates a first embodiment for a toggle mode transmitter circuit with capacitive boosted driver.

FIG. 6 illustrates a first embodiment for a toggle mode transmitter circuit with a capacitively boosted driver. FIG. 6 presents elements similar to those of FIG. 4 with similar numbering and labelling. More specifically, on the transmitter side, the toggle mode interface includes a data-path and pre-driver block 601 and a driver circuit including a pull-up transistor $Z_{DRV\_PU}$ 603 connected in series with a pull-down transistor $Z_{DRV\_PD}$ 605 between a high supply level $V_{CCQ2}$ and ground (or, more generally, a low supply level). In this example, both of $Z_{DRV\_PU}$ 603 and $Z_{DRV\_PD}$ 605 are both NMOS devices. As in FIG. 4, the data-path and pre-driver 601 is connected to a high supply level $V_{CCQ}$ that, depending on the embodiment, may be the same as or different than $V_{CCQ2}$. The data-path and pre-driver 601 receive an input signal (Data) and applies the corresponding signals generated from the input signal to the control gate of pull-up transistor $Z_{DRV\_PU}$ 603 and, in inverted form, to pull-down transistor $Z_{DRV\_PD}$ 605. The output of the driver is then applied to the transmission line 611 to supply the load, represented as resistor $R_{RX\_TRM}$ 621. In many examples, such as for the load corresponding to the one or more memory die as in the example embodiments here, the load will also have a capacitive component, although in the figures this will be represented as the resistance $R_{RX\_TRM}$ 521/621/711/821.

Relative to FIG. 4, the embodiment of FIG. 6 includes the circuit elements to capacitively boost the driver. A resistor $R_{FIX}$ 651 is now connected between the pull-up transistor $Z_{DRV\_PU}$ 603 and the driver's high supply level $V_{CCQ2}$. At a node between the pull-up transistor $Z_{DRV\_PU}$ 603 and resistor $R_{FIX}$ 651, a boost capacitor $C_{BOOST}$ 653 is connected, with its upper plate connect to the node and its lower plate connected to ground (or, more generally, the low voltage level). The resistor $R_{FIX}$ 651 helps to isolate the $V_{CCQ2}$ supply line from the driver and boost capacitor $C_{BOOST}$ 653, which can act as a localized charge reservoir when the pull-up transistor $Z_{DRV\_PU}$ 603 turns on.

Compared to the arrangement of FIG. 4, the addition of resistor $R_{FIX}$ 651 and a boost capacitor $C_{BOOST}$ 653 results in an effective transmitter pull-up impedance $Z_{DPU}$ of:

$$Z_{DPU} = (Z_{FIX} \| 1/j \times \omega \times C_{BOOST}) + Z_{DRV\_PU},$$

where $Z_{FIX}$ is the impedance of resistor $R_{FIX}$ 651, j is the unit imaginary number, ω is the angular frequency of the transmitted signals, ∥ indicates the parallel resistance value, and $Z_{DRV\_PU}$ is the impedance of the pull-up transistor $Z_{DRV\_PU}$ 603. As the effective impedance of the capacitor $C_{BOOST}$ 653 is inversely proportional to the frequency, at high frequencies there will be a lower driver impedance, which will boost the signal.

During pull-up, the current supplied to the transmission line can come from the charge stored on capacitor $C_{BOOST}$ 653 as well as the supply $V_{CCQ2}$. During pull-down, $C_{BOOST}$ 653 pulls current to get charged, thus slowing down the change in the current. Consequently, $\delta I/\delta t$ is reduced, thereby reducing the supply noise impact as the dynamic current demand from the supply $V_{CCQ2}$ is reduced by being isolated by $R_{FIX}$ 651. The capacitor $C_{BOOST}$ 653 can handle a large proportionate voltage drop. This allows for the capacitor $C_{BOOST}$ 653 to be significantly smaller than the corresponding on-die capacitance that would be needed for a single capacitance on the $V_{CCQ2}$ supply line so that, even though a $C_{BOOST}$ 653 is used for each data line's driver, the total needed capacitance, and area to implement it, is reduced.

Figure 7:
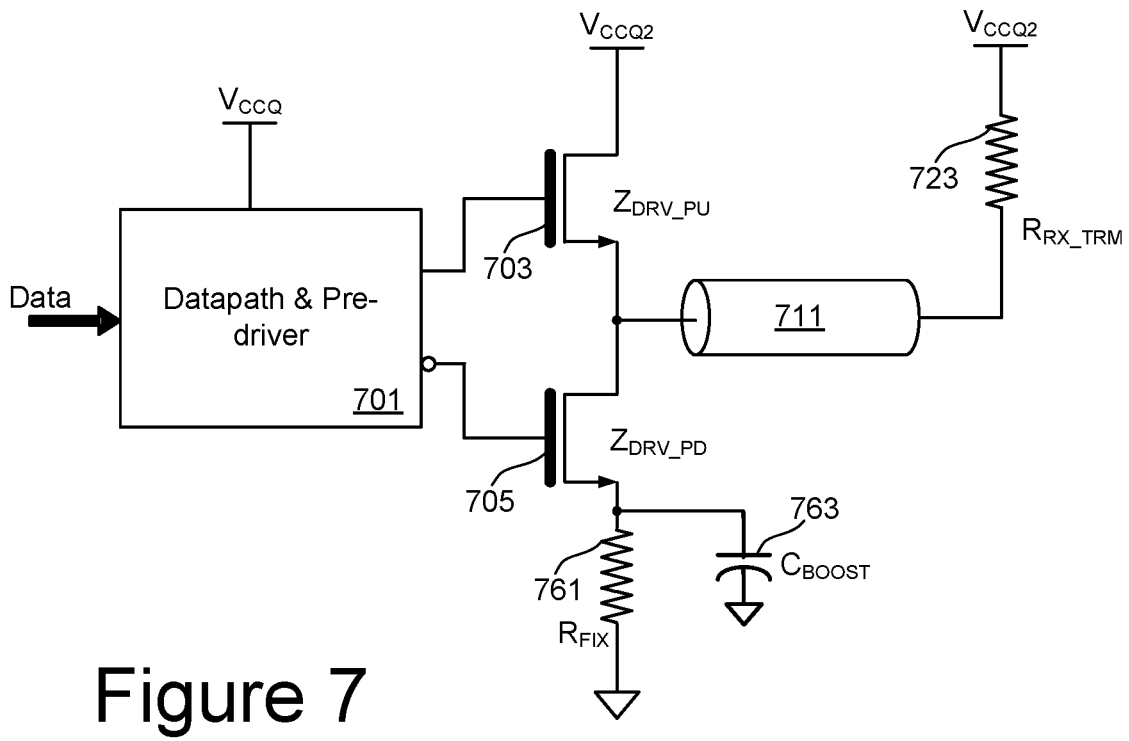
FIG. 7 illustrates an embodiment for a toggle mode transmitter circuit with capacitive boosted driver for a load in a pseudo-open drain configuration.
Figure 8:
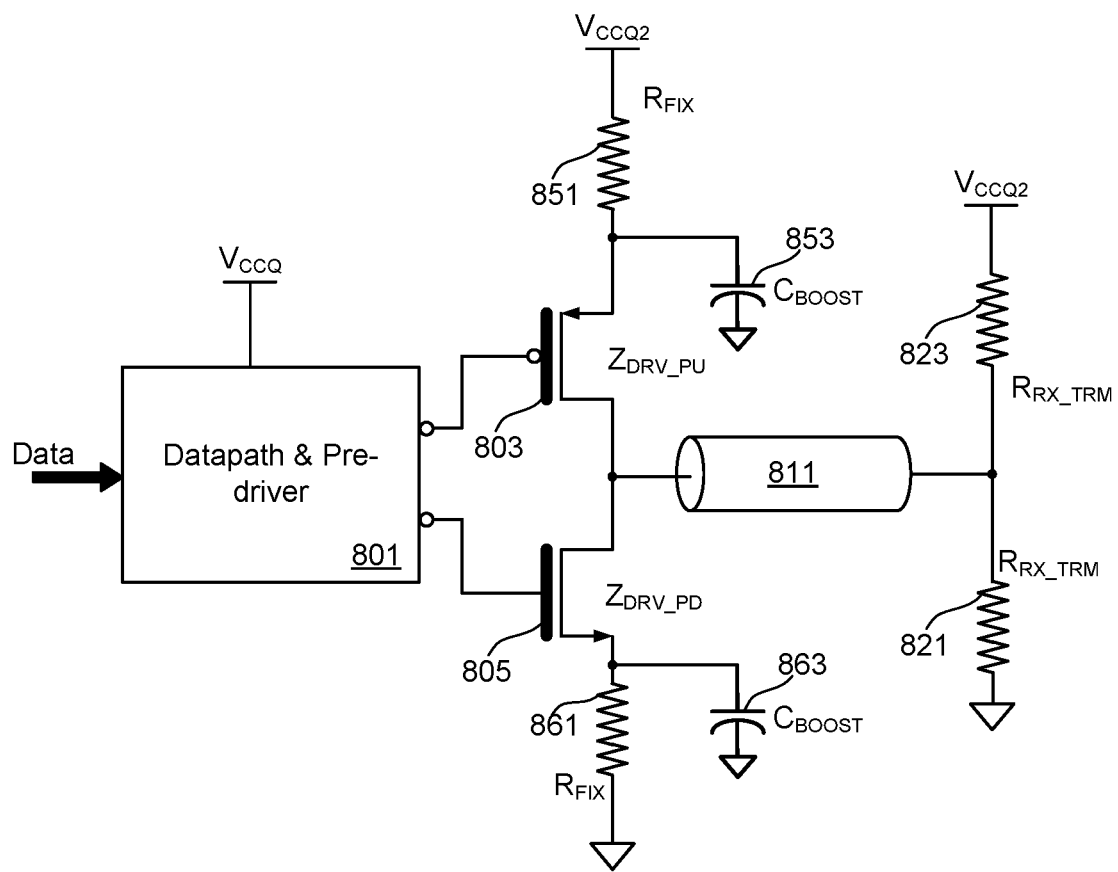
FIG. 8 illustrates an embodiment for a toggle mode transmitter circuit with capacitive boosted driver for a load in a center tap termination configuration.

The transmitter circuit with capacitive boosting in the embodiment of FIG. 6 uses a low voltage swing termination logic, or LVSTL, arrangement, where the load (e.g., a memory die) is represented as $R_{RX\_TRM}$ 621 connected between the transmission line 611 and the low supply level, here taken as ground. FIGS. 7 and 8 consider embodiments for use in a pseudo-open drain (POD) arrangement, where the load is connected between the transmission line and a high supply level, and in a center tap termination (CTT), where transmission line is connected at the load intermediate to the high and low supply levels.

FIG. 7 illustrates an embodiment for a toggle mode transmitter circuit with capacitively boosted driver for a load in a pseudo-open drain configuration. FIG. 7 again presents elements similar to those of FIG. 4 with similar numbering and labelling. More specifically, on the transmitter side, the toggle mode interface includes a data-path and pre-driver block 701 and a driver circuit including a pull-up transistor $Z_{DRV\_PU}$ 703 connected in series with a pull-down transistor $Z_{DRV\_PD}$ 705 between a high supply level $V_{CCQ2}$ and ground (or, more generally, a low supply level). In this embodiment, both of $Z_{DRV\_PU}$ 703 and $Z_{DRV\_PD}$ 705 are also implemented as NMOS devices. As in FIG. 4, the data-path and pre-driver 701 is connected to a high supply level $V_{CCQ}$ that, depending on the embodiment, may be the same as or different than $V_{CCW}$. The data-path and pre-driver 701 receive an input signal (Data) and applies the corresponding output signal directly to the control gate of pull-up transistor $Z_{DRV\_PU}$ 703 and, in inverted form, to pull-down transistor $Z_{DRV\_PD}$ 705. The output of the driver is then applied to the transmission line 711 to supply (to drive) the load, represented as resistor $R_{RX\_TRM}$ 723.

Unlike FIG. 4 and FIG. 6, in the pseudo-open drain configuration of FIG. 7 the load $R_{RX\_TRM}$ 723 is now connected between the transmission line 711 and the high supply level. Relative to FIG. 4, FIG. 7 adds a local boosting capacitor $C_{BOOST}$ 763 and an isolation resistor $R_{FIX}$ 761. With the POD termination for the load $R_{RX\_TRM}$ 723, the resistor $R_{FIX}$ 761 is now connected between the pull-down transistor $Z_{DRV\_PD}$ 705 and the low supply level, with the capacitor $C_{BOOST}$ 763 now connected to a node between the resistor $R_{FIX}$ 761 and the pull-down transistor $Z_{DRV\_PD}$ 705 on one plate and the low supply level on the other plate.

FIG. 8 illustrates an embodiment for a toggle mode transmitter circuit with capacitive boosted driver for a load in a center tap termination configuration and presents elements similar to those of FIG. 4 with similar numbering and labelling. More specifically, on the transmitter side, the toggle mode interface includes a data-path and pre-driver block 801 and a driver circuit including a pull-up transistor $Z_{DRV\_PU}$ 803 connected in series with a pull-down transistor $Z_{DRV\_PD}$ 805 between a high supply level $V_{CCQ2}$ and ground (or, more generally, a low supply level). In this embodiment, both the pull-up device $Z_{DRV\_PU}$ 803 is implemented as a PMOS device and the pull-down device $Z_{DRV\_PD}$ 805 is implemented as NMOS devices. As in FIG. 4, the data-path and pre-driver 801 is connected to a high supply level $V_{CCQ}$ that, depending on the embodiment, may be the same as or different than $V_{CCQ2}$. The data-path and pre-driver 801 receive an input signal (Data) and applies the corresponding output signal directly to the control gates of both of pull-up transistor $Z_{DRV\_PU}$ 803 and pull-down transistor $Z_{DRV\_PD}$ 805 in inverted form as $Z_{DRV\_PU}$ 803 is now a PMOS device. The output of the driver is then applied to the transmission line 811 to supply the load.

In the center tap termination of FIG. 8, the transmission line 811 is connected to the load at the center level voltage between the high and low supply levels, with the load now by the upper resistance $R_{RX\_TRM}$ 823 and the lower resistance $R_{RX\_TRM}$ 821. To account for both parts of the load, an isolation resistance and boosting capacitor are added on both sides of the driver. A resistor $R_{FIX}$ 851 is now connected between the pull-up transistor $Z_{DRV\_PU}$ 803 and the high supply level, with the capacitor $C_{BOOST}$ 853 connected to a node between the resistor $R_{FIX}$ 851 and the pull-up transistor $Z_{DRV\_PU}$ 803 on one plate and the low supply level on the other plate. Another isolation resistance $R_{FIX}$ 861 is now connected between the pull-down transistor $Z_{DRV\_PD}$ 805 and the low supply level, with the capacitor $C_{BOOST}$ 863 now connected to a node between the resistor $R_{FIX}$ 861 and the pull-down transistor $Z_{DRV\_PD}$ 805 on one plate and the low supply level on the other plate. (If the load were tapped at another point other than the center such that resistances of 821 and 823 were not equal, the respective values of 851/853 and 861/863 would be similarly shifted, where Finger 6 and 7 can be considered limiting cases.)

For any of the embodiments described above, the driver includes a pair of transistors connected in series biased between a high voltage supply level and a low voltage supply level, where the output node for supplying the data or transmission line is at a node between the transistors. Depending on the termination for the load (e.g., one or more memory die), one or both of the transistors are isolated from a respective supply level by a respective resistor, and a boost capacitor is connected between at least one of the supply levels and a node between the respective resistor and the transistor. Depending on the embodiment, the two transistors can be implemented as both NMOS devices, both PMOS devices, or a combination of these types of devices, where if they are both the same type of device, the data signals applied to their control gates are inverted relative to one another, and if of opposite type (as in FIG. 8) they receive the same signal. In any of these cases, at high frequencies, a lower driver impedance will boost the output signal. During pull-up, the charge current is distributed between the voltage supply and the boosting capacitor, while during pull-down the boosting capacitor is charged and slows down current changes for the supply, and likewise reduces $\delta I/\delta t$ noise. The values selected for isolating resistance ($R_{FIX}$) will depend on the implementation, but will typically be somewhat larger than either the load resistance ($R_{RX\_TRM}$) or the impedance of the transistor ($Z_{DRV\_PU}$ or $Z_{DRV\_PD}$), such a few times larger. With respect to the boosting capacitors, although these embodiments require a larger number of individual capacitors (one for each line), these are significantly smaller than would be the case for a single on-die capacitor for the supply line.

Figure 9:
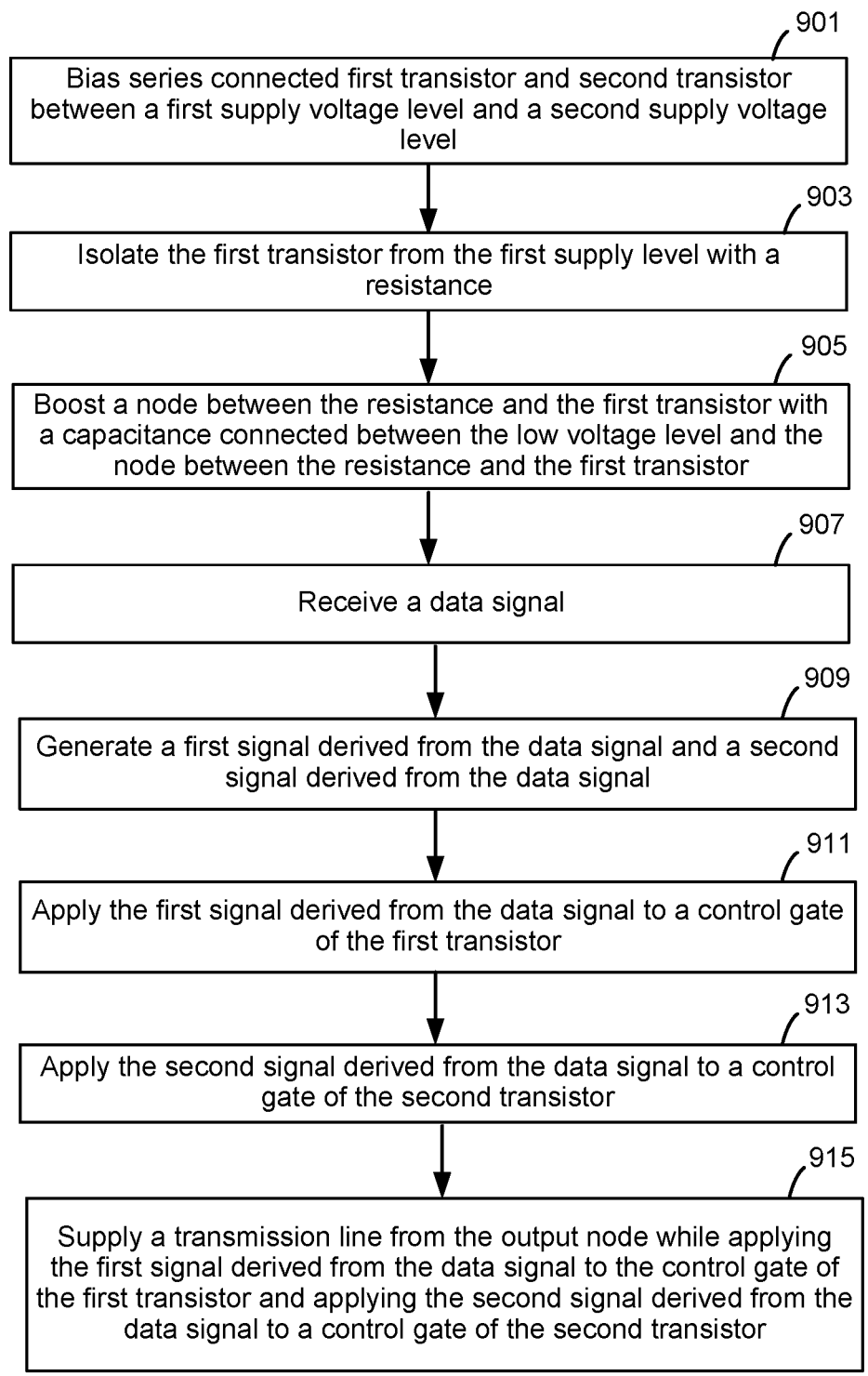
FIG. 9 is a flowchart of an embodiment for the high speed toggle operation of the transmitter circuits described with respect to FIGS. 6-8.

FIG. 9 is a flowchart of an embodiment for the high speed operation of the transmitter circuits described with respect to FIGS. 6-8. Starting at step 901, the series connected transistors 603/703/803 and 605/705/805 are biased between the high supply level $V_{CCQ2}$ and the low supply level of ground. In step 903, a resistor 551/761 or pair of resistors 851 and 861 respectively isolate the pull-up transistor $Z_{DRV\_PU}$ 603, the pull-down transistor $Z_{DRV\_PD}$ 705, or both the pull-up transistor $Z_{DRV\_PU}$ 803 and the pull-down transistor $Z_{DRV\_PD}$ 505 from at least one the supply levels. A node, or nodes in FIG. 8, are boosted by the capacitor or capacitors $C_{BOOST}$ 653/763/853 and 863 at step 905. Steps 901-905 bias the driver structure so that it can transmit data signal to the data or other transmission line.

At step 907 a data signal is received and, at step 909 the first and second control signals derived from the received data signal are generated. In the embodiments of FIGS. 6 and 7 these signals are inverses, while in the embodiment of FIG. 8 they are the same as the pull-up transistor is now a PMOS. At steps 911 and 913 the pair of control signals are respectively applied to the control gates of the pull-up transistor $Z_{DRV\_PU}$ 603/703/803 and pull-down transistor $Z_{DRV\_PD}$ 605/705/805. The resultant output signal is then supplied to the transmission line 611/711/811 at step 915.

According to a first set of aspects, an apparatus includes an interface configured to receive a data signal and supply the data signal to a transmission line. The interface includes: a data-path circuit configured to receive the data signal and generate therefrom a first signal derived from the data signal and receive a second signal derived from the data signal; and a driver configured to supply the transmission line from an output node. The driver comprises: a first transistor having a control gate connected to receive the first signal derived from the data signal and connected between a first supply level and the output node; a second transistor having a control gate connected to receive the second signal derived from the data signal and connected between a second supply level and the output node, the first supply level being one of a high supply level and a low supply level and the second supply level being another of a high supply level and a low supply level; a first resistor connected between the first supply level and first transistor; and a first capacitor connected to a node between the first transistor and one of the low supply level.

In additional aspects, a method includes: biasing a series connected first transistor and second transistor between a first supply voltage level and a second supply voltage level, the first transistor connected between the first supply voltage level and a output node, the second transistor connected between the second supply level and the output node, and the second supply level being another of a high supply level and a low supply level; isolating the first transistor from the first supply level with a resistance; boosting a node between the resistance and the first transistor with a capacitance connected between the low voltage level and the node between the resistance and the first transistor; receiving a data signal; generating a first signal derived from the data signal and a second signal derived from the data signal; applying the first signal derived from the data signal to a control gate of the first transistor; applying the second signal derived from the data signal to a control gate of the second transistor; and supplying a transmission line from the output node while applying the first signal derived from the data signal to the control gate of the first transistor and applying the second signal derived from the data signal to a control gate of the second transistor.

In another set of aspects, a non-volatile memory device includes a memory controller, comprising one or more interfaces configured to transfer data to one or more memory die on a plurality of data lines. Each of the interfaces comprises: for each of the plurality of data lines, a data-path circuit configured to receive a data signal and generate therefrom a first signal derived from the data signal and receive a second signal derived from the data signal; and, for each data-path circuit, a corresponding driver configured to supply the data line from an output node. Each corresponding driver comprises: a first transistor having a control gate connected to receive the first signal derived from the data signal and connected between a first supply level and the output node; a second transistor having a control gate connected to receive the second signal derived from the data signal and connected between a second supply level and the output node, the first supply level being one of a high supply level and a low supply level and the second supply level being another of a high supply level and a low supply level; a first resistor connected between the first supply level and first transistor; and a first capacitor connected to a node between the first transistor and one of the low supply level.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

We claim:

1. An apparatus, comprising:
an interface configured to receive a data signal and supply the data signal to a transmission line, comprising:

a data-path circuit configured to receive the data signal and generate therefrom a first signal derived from the data signal and receive a second signal derived from the data signal; and a driver configured to drive the transmission line from an output node, comprising:

a first transistor having a control gate connected to receive the first signal derived from the data signal and connected between a first supply level and the output node;

a second transistor having a control gate connected to receive the second signal derived from the data signal and connected between a second supply level and the output node, the first supply level being one of a high supply level and a low supply level and the second supply level being another of the high supply level and the low supply level;

a first resistor connected between the first supply level and first transistor; and a first capacitor connected to a node between the first transistor and the low supply level.

2. The apparatus of claim 1, wherein the first supply level is the high supply level, the second supply level is the low supply level, the first transistor and the second transistor are NMOS devices, and the second signal derived from the data signal is an inverse of the first signal derived from the data signal.

3. The apparatus of claim 1, wherein the first supply level is the low supply level, the second supply level is the high supply level, the first transistor and the second transistor are NMOS devices, and the first signal derived from the data signal is an inverse of the second signal derived from the data signal.

4. The apparatus of claim 1, wherein the first supply level is the high supply level, the second supply level is the low supply level, the first transistor is a PMOS device, the second transistor is an NMOS device, and the second signal derived from the data signal is the same as the first signal derived from the data signal, the driver further comprising:

a second resistor connected between the second supply level and second transistor; and a second capacitor connected to a node between the second transistor and the low supply level.

5. The apparatus of claim 1, wherein the interface is configured to supply the data signal to the transmission line in a toggle mode format.

6. The apparatus of claim 1, wherein the interface is part of a memory controller and the transmission line is connected to supply the data signal to one or more memory die.

7. The apparatus of claim 6, wherein the data-path circuit comprises:

a buffer configured to receive the data signal.

8. The apparatus of claim 1, wherein the interface is part of a control circuit for a memory die and the transmission line is connected to supply the data signal to a memory controller.

9. The apparatus of claim 8, wherein the control circuit is formed on a control die and the memory die formed separately from and bonded to the control die.

10. A method, comprising:

biasing a series connected first transistor and second transistor between a first supply voltage level and a second supply voltage level, the first transistor connected between the first supply voltage level and an output node, the second transistor connected between the second supply level and the output node, and the first supply level being one of a high supply level and a low supply level and the second supply level being another of the high supply level and the low supply level;

isolating the first transistor from the first supply level with a resistance;

boosting a node between the resistance and the first transistor with a capacitance connected between the low supply level and the node between the resistance and the first transistor;

receiving a data signal;

generating a first signal derived from the data signal and a second signal derived from the data signal;

applying the first signal derived from the data signal to a control gate of the first transistor;

applying the second signal derived from the data signal to a control gate of the second transistor; and driving a transmission line from the output node while applying the first signal derived from the data signal to the control gate of the first transistor and applying the second signal derived from the data signal to a control gate of the second transistor.

11. A non-volatile memory device, comprising:

a memory controller, comprising:

one or more interfaces configured to transfer data to one or more memory die on a plurality of data lines, each of the interfaces comprising:

for each of the plurality of data lines, a data-path circuit configured to receive a data signal and generate therefrom a first signal derived from the data signal and receive a second signal derived from the data signal; and for each data-path circuit, a corresponding driver configured to drive the data line from an output node, the corresponding driver comprising:

a first transistor having a control gate connected to receive the first signal derived from the data signal and connected between a first supply level and the output node;

a second transistor having a control gate connected to receive the second signal derived from the data signal and connected between a second supply level and the output node, the first supply level being one of a high supply level and a low supply level and the second supply level being another of the high supply level and the low supply level;

a first resistor connected between the first supply level and first transistor; and a first capacitor connected to a node between the first transistor and the low supply level.

12. The non-volatile memory device of claim 11, wherein the one or more memory die are a plurality of non-volatile memory die, the non-volatile memory device further comprising:

the plurality of data lines; and the plurality of memory die, each of the data lines connected to each of the plurality of data lines.

13. The non-volatile memory device of claim 12, wherein the plurality of non-volatile memory die are NAND memory devices having a three-dimensional architecture.

14. The non-volatile memory device of claim 12, wherein one or more of the plurality of non-volatile memory die are magnetoresistive memory devices.

15. The non-volatile memory device of claim 11, wherein the data to the one or more memory die includes host data and an address for a write command.

16. The non-volatile memory device of claim 11, wherein the first supply level is the high supply level, the second supply level is the low supply level, the first transistor and the second transistor are NMOS devices, and the second signal derived from the data signal is an inverse of the first signal derived from the data signal.

17. The non-volatile memory device of claim 11, wherein the first supply level is the low supply level, the second supply level is the high supply level, the first transistor and the second transistor are NMOS devices, and the first signal derived from the data signal is an inverse of the second signal derived from the data signal.

18. The non-volatile memory device of claim 11, wherein the first supply level is the high supply level, the second supply level is the low supply level, the first transistor is a PMOS device, the second transistor is an NMOS device, and the second signal derived from the data signal is the same as the first signal derived from the data signal, the driver further comprising:
   a second resistor connected between the second supply level and second transistor; and
   a second capacitor connected to a node between the second transistor and one of the low supply level.

19. The non-volatile memory device of claim 11, wherein each of the one or more interfaces is configured to supply the data signal to the plurality of data lines in a toggle mode format.

20. The non-volatile memory device of claim 11, wherein each of the data-path circuits comprises:
   a buffer configured to receive the data signal.

* * * * *